(12) United States Patent
Koma

(10) Patent No.: US 7,630,027 B2
(45) Date of Patent: Dec. 8, 2009

(54) DISPLAY DEVICE HAVING A METAL POLARIZING LAYER DISPOSED BETWEEN A FIRST SUBSTRATE AND A COMMON ELECTRODE WHICH ITSELF IS DISPOSED BETWEEN A LIQUID CRYSTAL LAYER AND THE FIRST SUBSTRATE

(75) Inventor: Norio Koma, Motosu-gun (JP)

(73) Assignee: Epson Imaging Devices Corporation, Nagano (JP)

( * ) Notice: Subject to any disclaimer, the term of this patent is extended or adjusted under 35 U.S.C. 154(b) by 557 days.

(21) Appl. No.: 11/436,712

(22) Filed: May 19, 2006

(65) Prior Publication Data

US 2006/0262242 A1    Nov. 23, 2006

(30) Foreign Application Priority Data

| May 20, 2005 | (JP) | ............................. | 2005-148542 |
| May 20, 2005 | (JP) | ............................. | 2005-148543 |
| May 20, 2005 | (JP) | ............................. | 2005-148544 |
| Jul. 7, 2005 | (JP) | ............................. | 2005-199434 |
| Jul. 22, 2005 | (JP) | ............................. | 2005-213453 |

(51) Int. Cl.
  *G02F 1/1335* (2006.01)
(52) U.S. Cl. ............................. 349/69; 349/96; 349/110; 349/113; 349/201
(58) Field of Classification Search ................. 349/63, 349/69, 96, 113, 201, 202, 110
See application file for complete search history.

(56) References Cited

U.S. PATENT DOCUMENTS

| 5,275,680 A | 1/1994 | Sirkin et al. |
| 5,796,509 A | 8/1998 | Doany et al. |
| 6,025,894 A | 2/2000 | Shirasaki et al. |
| 6,181,394 B1 | 1/2001 | Sanelle et al. |

(Continued)

FOREIGN PATENT DOCUMENTS

CN    1577001    2/2005

(Continued)

OTHER PUBLICATIONS

European Search Report mailed on Feb. 27, 2006 for European Application No. 05026116.3 filed on Nov. 29, 2005, 10 pages.

(Continued)

*Primary Examiner*—John Heyman
(74) *Attorney, Agent, or Firm*—Morrison & Foerster LLP

(57) ABSTRACT

The invention is directed to the higher contrast in a display device with a lighting device as a front light and a reflective LCD. A lighting device is disposed, being opposed to a front surface of a reflective electrode of a reflective LCD. An organic EL element layer including an anode, a cathode patterned into stripes, and an organic layer is formed in the lighting device. A region of the organic layer corresponding to the cathode serves as an emissive region. A light shield layer is formed covering the cathode. Furthermore, a diffraction grating made of an aluminum layer and having a plurality of fine slits formed by patterning is disposed on the reflective LCD, as a polarizing layer that can be formed thinner as much as possible.

17 Claims, 9 Drawing Sheets

U.S. PATENT DOCUMENTS

| | | |
|---|---|---|
| 6,208,391 B1 | 3/2001 | Fukushima et al. |
| 6,441,873 B2 | 8/2002 | Young |
| 6,528,824 B2 | 3/2003 | Yamagata et al. |
| 6,542,207 B1 | 4/2003 | Yoshizawa |
| 6,556,260 B1 | 4/2003 | Itou et al. |
| 6,671,014 B2 | 12/2003 | Yokoyama et al. |
| 6,723,392 B1 | 4/2004 | Jinnai et al. |
| 7,034,911 B2 | 4/2006 | Kato |
| 7,245,343 B2 | 7/2007 | Suzuki et al. |
| 7,248,331 B2 | 7/2007 | Miyatake et al. |
| 2001/0035924 A1 | 11/2001 | Fujieda |
| 2002/0122144 A1 | 9/2002 | Yoshida et al. |
| 2003/0156239 A1* | 8/2003 | Inoue et al. ............... 349/113 |
| 2003/0209707 A1 | 11/2003 | Tsuchiya |
| 2003/0214227 A1 | 11/2003 | Tsuchiya |
| 2004/0109106 A1* | 6/2004 | Yang et al. ............... 349/69 |
| 2004/0125449 A1 | 7/2004 | Sales |
| 2004/0141103 A1 | 7/2004 | Kotchick et al. |
| 2004/0141106 A1 | 7/2004 | Wu et al. |
| 2004/0179154 A1 | 9/2004 | Hong |
| 2004/0206960 A1 | 10/2004 | Nishikawa |
| 2005/0001545 A1 | 1/2005 | Aitken et al. |
| 2005/0056840 A1 | 3/2005 | Yamazaki et al. |
| 2005/0088594 A1 | 4/2005 | Mitsui et al. |
| 2006/0132671 A1 | 6/2006 | Koma |
| 2006/0261337 A1 | 11/2006 | Koma |
| 2006/0279673 A1 | 12/2006 | Tanase et al. |
| 2008/0303983 A1 | 12/2008 | Tanase et al. |
| 2008/0309850 A1 | 12/2008 | Tanase et al. |

FOREIGN PATENT DOCUMENTS

| | | |
|---|---|---|
| JP | 05-325586 | 12/1993 |
| JP | 2002-216961 A | 8/2002 |
| JP | 2003-255375 | 9/2003 |
| JP | 2004-145067 | 5/2004 |
| WO | WO-2004/023173 | 3/2004 |

OTHER PUBLICATIONS

European Search Report mailed on Sep. 18, 2006 for European Application No. 06010532.7 filed on May 22, 2006, 8 pages.

Tanase et al., U.S. Office Action mailed on Nov. 14, 2007 directed towards related U.S. Appl. No. 11/436,883; 8 pages.

Koma et al., U.S. Office Action mailed on Jun. 11, 2008 directed towards related U.S. Appl. No. 11/436,638; 11 pages.

Koma et al., U.S. Office Action mailed on Nov. 13, 2008 directed towards related U.S. Appl. No. 11/288,411; 21 pages.

Koma et al., U.S. Office Action mailed on Dec. 3, 2008 directed towards related U.S. Appl. No. 11/436,638; 12 pages.

Koma et al., U.S. Office Action mailed on Apr. 28, 2009 directed towards related U.S. Appl. No. 11/436,638; 11 pages.

European Office Action mailed on Aug. 20, 2008 for European Application No. 06010532.7; (8 pages).

European Office Action mailed on Apr. 22, 2008 for European Application No. 06010532.7; (8 pages).

Tanase et al., U.S. Office Action mailed May 28, 2009, directed towards U.S. Appl. No. 12/198,529; (5 pages).

* cited by examiner

DISPLAY DEVICE HAVING A METAL POLARIZING LAYER DISPOSED BETWEEN A FIRST SUBSTRATE AND A COMMON ELECTRODE WHICH ITSELF IS DISPOSED BETWEEN A LIQUID CRYSTAL LAYER AND THE FIRST SUBSTRATE

CROSS-REFERENCE OF THE INVENTION

This invention is based on Japanese Patent Applications Nos. 2005-148542, 2005-148543, 2005-148544, 2005-199434, and 2005-213453, the contents of which are incorporated herein by reference in their entirety.

BACKGROUND OF THE INVENTION

1. Field of the Invention

The invention relates to a display device, specifically to a display device having a lighting device and a reflective liquid crystal display device.

2. Description of the Related Art

A liquid crystal display device (hereafter, referred to as a LCD) is thin and consumes low power in its characteristics, and has been broadly used as a monitor of a computer or a monitor of a mobile data terminal such as a cellular phone. There are a transmissive LCD, a reflective LCD, and a semi-transmissive LCD as the LCD. In the transmissive LCD, a transparent electrode is used as a pixel electrode for applying a voltage to a liquid crystal and a back light is set in the rear of the LCD, so that a bright display can be realized by controlling a transmission amount of light of this back light even in the dark. However, in an environment where external light is strong such as out of doors in the daytime, a contrast can not be obtained enough.

The reflective LCD uses external light such as sunlight or interior light as a light source, and reflects the external light entering the LCD by a reflective pixel electrode formed of a reflective layer formed on a substrate on a viewer side. The reflective LCD makes a display by controlling an amount of light released from a LCD panel in each of the pixels after the light enters a liquid crystal and is reflected by the reflective pixel electrode. Since this reflective LCD uses external light as a light source, there is a problem that the display can not be made in an environment of no external light.

The semi-transmissive LCD has both the transmissive function and the reflective function, and is applicable to both the bright and dark environments. However, since this semi-transmissive LCD has a transmissive region and a reflective region in a pixel, there is a problem of low display efficiency in each of the pixels.

For solving this, it has been suggested that a front light is provided in the reflective LCD to realize a display even in the dark environment. FIG. 13 is a view showing a display device with the reflective LCD and the front light of a conventional art. A transparent acrylic plate 110 is disposed, being opposed to a display surface of a reflective LCD 100. A plurality of grooves 111 shaped in inverted triangles is formed on a surface of this transparent acrylic plate 110, which is on the opposite side to the side opposed to the reflective LCD 100. Furthermore, a light source 112 is disposed on a side surface of the transparent acrylic plate 110. Light entering the transparent acrylic plate 10 from the light source 112 is refracted in a direction to the reflective LCD 100 by inclined surfaces of the grooves 111 shaped in inverted triangles, and enters the display surface of the reflective LCD 100.

The relating technology is described in the Japanese Patent Application Publication Nos. 2003-255375 and H5-325586.

However, the light entering the transparent acrylic plate 110 from the light source 112 is refracted in a direction to a viewer 113 on the opposite side to the reflective LCD 100 by a small amount as well as in the direction to the reflective LCD 100 by the inclined surfaces of the grooves 111 shaped in inverted triangles provided in the transparent acrylic plate 110. Therefore, the small amount of light leaks from the transparent acrylic plate 110 to reach eyes of the viewer 113, causing a problem of degrading the contrast of the LCD display.

SUMMARY OF THE INVENTION

The invention is made for solving the above problem, and provides a display device having a lighting device and a reflective liquid crystal display device with the following feature. That is, the lighting device has a first substrate and a light emitting element disposed on the first substrate, where one surface of the light emitting element is opposed to a display surface of the reflective liquid crystal display device. The reflective liquid crystal display device has a polarizing layer, a common electrode, a reflective electrode opposed to a common electrode, a pair of alignment films disposed on the common electrode and the reflective electrode respectively, a liquid crystal layer interposed between the common electrode and the reflective electrode, and a second substrate disposed with the reflective electrode. The polarizing layer is a diffraction grating made by patterning a metal layer. Alternatively, the polarizing layer is made of dichromatic dye molecules regularly aligned by coating and setting a solution containing dichromatic dye molecules.

The display device of the invention can enhance the contrast in both the bright and dark environments, increase a use efficiency of light emitted by the lighting device, and minimize the total thickness of the display device.

DETAILED DESCRIPTION OF THE INVENTION

Figure 1:
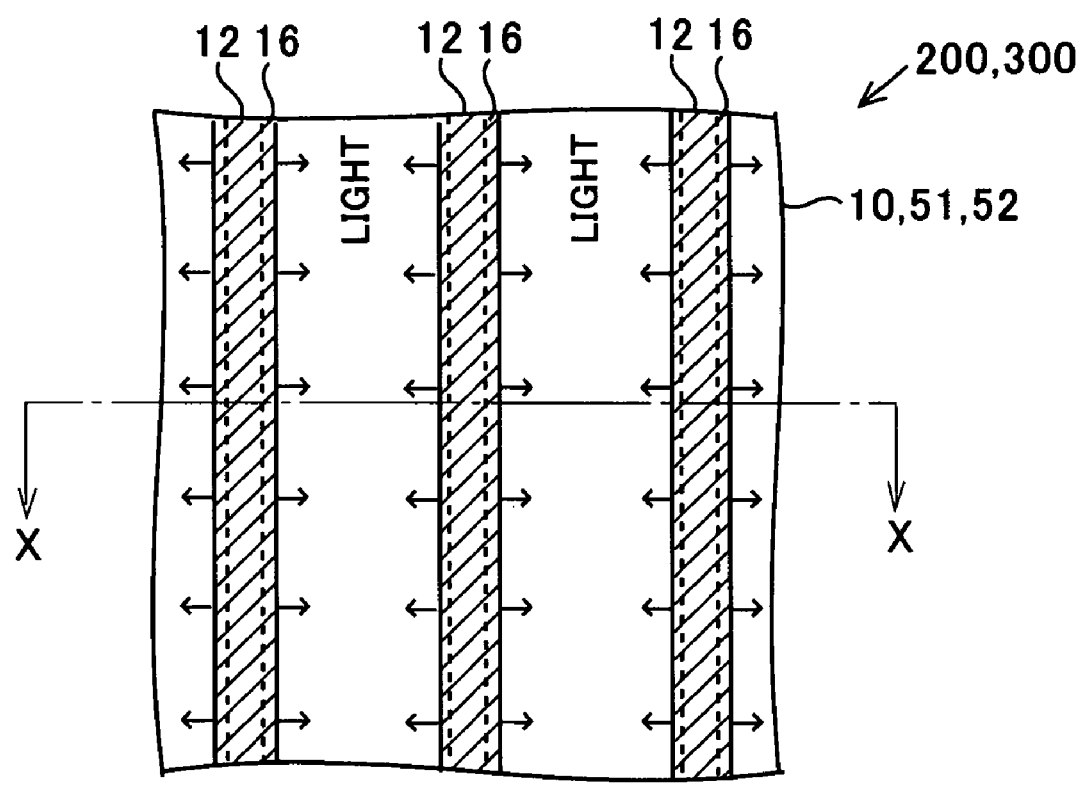
FIG. 1 is a plan view of a display device of first to third embodiments of the invention on a lighting device side.
Figure 2:
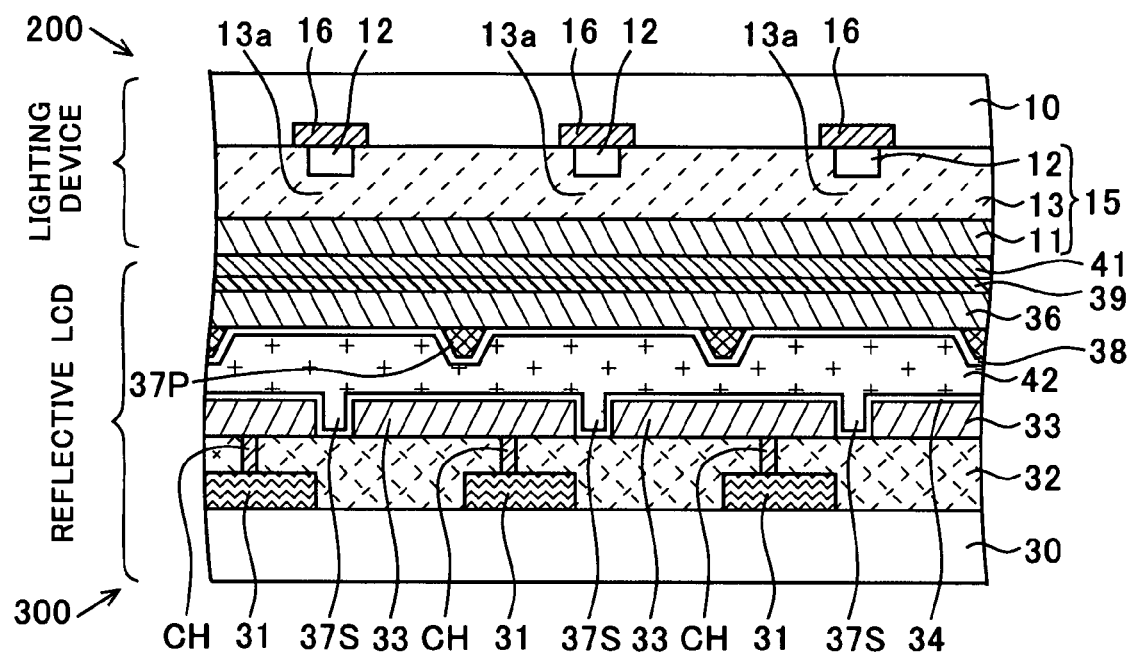
FIG. 2 is a cross-sectional view showing a display device of the first embodiment of the invention.
Figure 3:
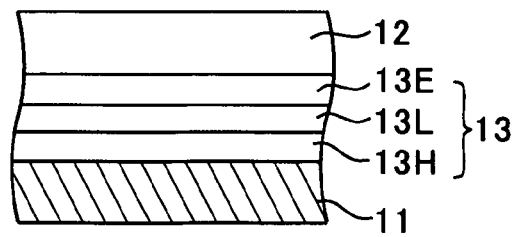
FIG. 3 is a conceptual diagram showing an organic layer of the display device of the first to third embodiments of the invention.

A display device of a first embodiment of the invention will be described FIGS. 1-5. FIG. 1 is a plan view of the display device having a lighting device and a reflective LCD (liquid crystal display device) of this embodiment on the lighting device side. It is noted that FIG. 1 does not show all components of the device. FIG. 2 is a cross-sectional view of FIG. 1 along line X-X. FIG. 3 is a conceptual diagram showing a lamination relationship among layers forming an organic layer 13 of FIG. 2.

A lighting device 200 is disposed with its light emitting surface opposed to a display surface of a reflective LCD 300 as shown in FIGS. 1 and 2. That is, the lighting device 200 is a light source of a front light of the reflective LCD 300.

A structure of the lighting device 200 will be described first. An organic electroluminescent element layer 15 (hereafter, abbreviated to an "organic EL element layer 15") is formed on a transparent substrate 10 made of a glass substrate or the like. The organic EL element layer 15 includes an anode 11 made of a transparent conductive material such as ITO (Indium Tin Oxide) or IZO (Indium Zinc Oxide), the organic layer 13 formed on this anode 11, and a cathode 12 formed on the organic layer 13 and patterned into a predetermined shape with a predetermined pitch, for example, stripes.

The organic layer 13 includes a so-called electron transport layer 13E, an emissive layer 13L, and a hole transport layer 13H as shown in FIG. 3. The cathode 12 includes, for example, an aluminum layer (Al layer), a layered body of a magnesium layer (Mg layer) and a silver layer (Ag layer), or a calcium layer (Ca layer). It is preferable that the anode 11 is about 100 nm, the cathode 12 is about 500 nm, and the organic layer 13 is about 100 nm in thickness.

In this organic EL element layer 15, a region of the organic layer 13 interposed between the anode 11 and the cathode 12 is an emissive region 13a. That is, a region of the organic layer 13 immediately under the cathode 12 is the emissive region 13a, and the organic EL element layer 15 in this region functions as a light emitting element. In a plan view of this emissive region 13a, this emissive region 13a has the same predetermined shape as that of the cathode 12, that is, forms stripes. This emissive region 13a emits light (unpolarized light) by applying a positive potential to the anode 11 and a negative potential to the cathode 12. The other region of the organic layer 13 does not emit light as a non-emissive region. Light emitted by the emissive region 13a proceeds in a direction perpendicular to the longitudinal direction of the stripes of the emissive region 13a equally from the emissive region 13a.

Furthermore, a light shield layer 16 is formed covering the cathode 12 patterned into stripes. The light shield layer 16 is also patterned into the same shape as that of the cathode 12, that is, stripes. The light shield layer 16 is provided for shielding light emitted upward from the emissive region 13a, and thus need have a function as a light reflection layer for reflecting light or a light absorption layer for absorbing light.

The light shield layer 16 is made of, for example, a chromium (Cr) or aluminum oxide ($Al_2O_3$) layer or the like if it functions as the light reflection layer. If the light shield layer 16 functions as the light absorption layer, it is made of a black pigment layer made of a photoresist material containing a black pigment, a black dye layer made of a photoresist material containing black dye, a chromium oxide layer, or the like. The light shield layer 16 is preferably about 10 nm or less in thickness.

Light emitted downward (on the opposite side to the viewer 113) from the emissive region 13a of the lighting device 200 enters the reflective LCD 300 through the transparent anode 11. Light emitted upward (in the direction to the viewer 113) from the emissive region 13a is reflected downward or absorbed by the cathode 12 and the light shield layer 16. Therefore, light from the emissive region 13a is minimized from directly entering the eyes of the viewer 113 watching the lighting device 200 from thereabove.

Figure 4:
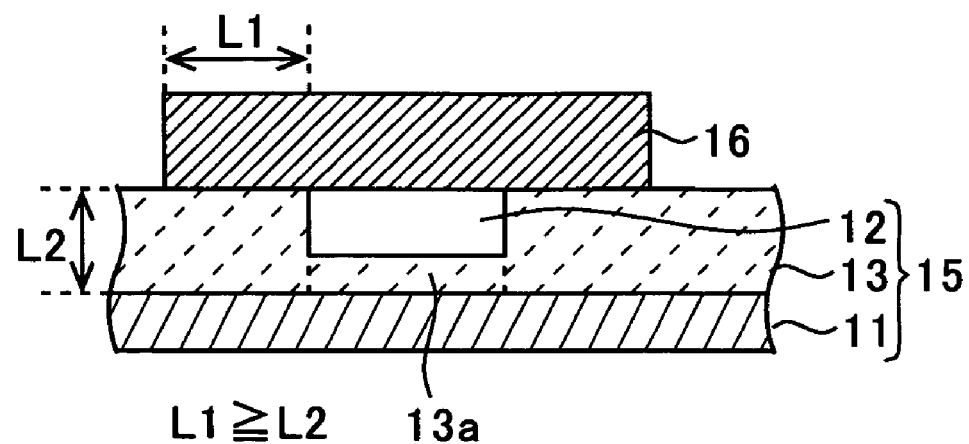
FIG. 4 is an enlarged partial cross-sectional view of the display device of the first to third embodiments of the invention.

It is preferable that the width of the light shield layer 16 is larger than the width of the patterned cathode 12 for enhancing this light shield effect. Furthermore, it is preferable that a length L1 between the edge of the patterned cathode 12 and the edge of the light shield layer 16 is equal to or larger than the total thickness L2 of the emissive region 13a of the organic layer 13 and the patterned cathode 12 for further enhancing the light shield effect, as shown in FIG. 4.

Although the cathode 12 is patterned into a predetermined shape with a predetermined pitch, for example, stripes and the anode 11 is not patterned in the structure of the embodiment, it is possible to change positions of the cathode 12 and the anode 11 as a modification to this embodiment. That is, it is possible to place the anode 11 in the position of the cathode 12 and the cathode 12 in the position of the anode 11 in FIG. 2. In this case, the anode 11 is patterned into the predetermined shape and the cathode 12 is not patterned. That is, a region of the organic layer 13 immediately on the anode 11 serves as the emissive region 13a.

In another modification, it is possible that the anode 11 and the cathode 12 are formed on the whole surface without patterned at all and at least one of the three layers of the electron transport layer 13E, the emissive layer 13L, and the hole transport layer 13H forming the organic layer 13 is patterned in the predetermined shape. In this case, a region where all the three layers are superposed is the emissive region, and a region where any one of the three layers is missing is the non-emissive region.

Furthermore, it is preferable that the pitch of the patterned cathode 12 (alternatively, the anode 11, or any one of the three layers forming the organic layer 13) is about 1 mm or less for preventing the viewer 113 from sensing a discomfort in the eyes when light emitted by the emissive region 13a is reflected by the reflective LCD 300 and visually recognized by the viewer 113.

Descriptions will be given supposing that the cathode 12 is patterned into a predetermined shape, that is, stripes, hereafter. This embodiment also has the same structure, performs the same operation, and has the same effect even in the case where the other layer than the cathode 12 is patterned as a layer determining the emissive region 13a, as described above.

Next, a structure of the reflective LCD 300 will be described. As shown in FIG. 2, a switching thin film transistor 31 (hereafter, abbreviated to "TFT") is formed on each of a plurality of pixel regions sectioned on the TFT substrate 30 made of, for example, a glass substrate. The TFT 31 is covered with an interlayer insulation film 32. A pixel electrode made of, for example, a metal material reflecting light such as aluminum (Al) or the like, that is, a reflective electrode 33 is formed on the interlayer insulation film 32, corresponding to each of the TFTs 31. The reflective electrode 33 is connected with a drain or a source of the corresponding TFT 31 by a conductive filling member (not shown) or the like through a contact hole CH formed in the interlayer insulation film 32.

A separating region, that is, a slit 37S having a predetermined width is provided between the adjacent reflective electrodes 33. This slit 37S has a function as an alignment control portion for multi-domain alignment of a liquid crystal layer 42 that will be described below. An alignment film 34 for aligning liquid crystal molecules at a predetermined angle relative to the TFT substrate 30 is formed covering the reflective electrodes 33 and the slits 37S.

A common electrode 36 made of, for example, ITO is disposed, being opposed to the TFT substrate 30 formed with the reflective electrodes 33. Projections 37P as alignment control portions for multi-domain alignment of liquid crystal molecules of the liquid crystal layer 42 in predetermined two different directions, that will be described below, are formed on the front surface (the surface opposed to the TFT substrate 30) of the common electrode 36. The projections 37P are formed by patterning a resist material for example. An alignment film 38 is further formed covering the common electrodes 36 and the projections 37P.

A λ/4 wavelength plate 39 (a quarter wavelength plate) is disposed on the back surface (the surface opposed to the viewer 113) of the common electrode 36, as a retardation plate for causing optical retardation of a quarter of a wavelength λ of light. The λ/4 wavelength plate 39 changes linearly polarized light to circularly polarized light, or changes circularly polarized light to linearly polarized light. It is possible to further laminate a λ/2 wavelength plate (a half wavelength plate) (not shown) causing optical retardation of a half of a wavelength λ of light on this λ/4 wavelength plate 39 for the polarization change of broadband light. A light scattering layer 40 made of, for example, a diffusion adhesion layer is further laminated on the λ/4 wavelength plate 39. The light scattering layer 40 is provided for scattering light emitted from the lighting device 200 so as to irradiate the reflective electrode 33 with the light.

Furthermore, a polarizing layer 41 is laminated on the light scattering layer 40. The polarizing layer 41 has a predetermined polarization axis, and extracts linearly polarized light from light entering the polarizing layer 41, corresponding to its polarization axis.

Figure 5:
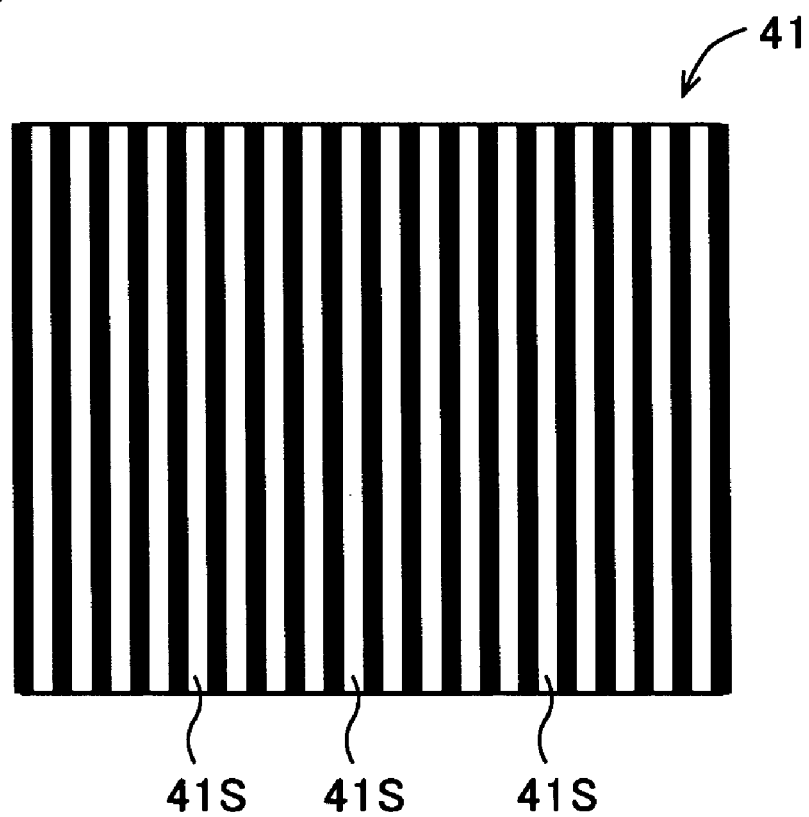
FIG. 5 is a plan view showing a polarizing layer of the display device of the first to third embodiments of the invention.

The polarizing layer 41 will be described referring to figures. FIG. 5 is a plan view of the polarizing layer 41 of FIG. 2. The polarizing layer 41 is made of a diffraction grating having a plurality of fine slits 41S disposed in stripes as shown in FIG. 5. This diffraction grating is preferably made of an aluminum (Al) layer. It is preferable to form this diffraction grating by a deposition method such as a sputtering that is used for a process of manufacturing a display device or a semiconductor device. In this case, an aluminum layer is formed on the anode 11 of the organic EL element layer 15 of the lighting device 200, and then a resist layer is formed in a predetermined pattern thereon by a photolithography. Then, the aluminum layer is etched using this resist layer as a mask.

The width of each of the slits 41S of the diffraction grating formed in the aluminum layer is, for example, about 0.5 μm to 3 μm although not particularly limited to this as long as the layer has the predetermined polarization axis and can realize linearly polarized light. The diffraction grating of the aluminum layer can be formed thinner than a polarizing layer made of PVA (polyvinyl alcohol) or the like that is generally used. The thickness of the diffraction grating is, for example, about 1 μm in this embodiment although not particularly limited to this as long as it is thinner than the polarizing layer made of the generally used PVA (polyvinyl alcohol) or the like. It is noted that the diffraction grating forming the polarizing layer 41 can be made of the other metal by the other deposition method than above as long as the above condition is satisfied.

A liquid crystal layer 42 is sealed between the TFT substrate 30 and the common electrode 36. The liquid crystal layer 42 is made of, for example, liquid crystal molecules (e.g. a nematic liquid crystal) having positive dielectric anisotropy and helically aligned to have a predetermined optical rotatory power, and operates in a TN (Twisted Nematic) mode or a MTN (Mixed TN) mode.

This liquid crystal layer 42 can be the other liquid crystal layer than above as long as it is suitable for the reflective LCD using a sheet of polarizing layer 41. That is, the liquid crystal layer 42 can be made of liquid crystal molecules (e.g. a nematic liquid crystal) having positive dielectric anisotropy and homogeneously aligned, and operate in an electrically controlled birefringence mode, that is, a ECB mode.

Alternatively, the liquid crystal layer 42 can be made of liquid crystal molecules (e.g. a nematic liquid crystal) having negative dielectric anisotropy and vertically aligned, and operate in a vertical aligned mode, that is, a VA mode.

Next, the connection between the lighting device 200 and the reflective LCD 300 will be described. The lighting device 200 is disposed above the reflective LCD 300, being in contact with each other as shown in FIGS. 1 and 2. If a glass substrate or an air layer exists between the lighting device 200 and the reflective LCD 300, light emitted by the organic EL element layer 15 of the lighting device 200 is reflected when entering the glass layer or the air layer and returns to the viewer side, degrading the contrast. Furthermore, particularly the glass layer existing between the lighting device 200 and the reflective LCD 300 decreases a use efficiency of light emitted by the organic EL element layer 15.

Therefore, the display surface of the reflective LCD 300, that is, the polarizing layer 41 is directly formed on the emissive surface of the lighting device 200, that is, on the anode 11 of the organic EL element layer 15. By such connection of the lighting device 200 and the reflective LCD 300, the use efficiency of light emitted by the organic EL element layer 15 can be enhanced.

Next, a positional relationship between the lighting device 200 and the reflective LCD 300 will be described. A pitch P1 of the cathode 12 and the light shield layer 16 of the lighting device 200 is equal to a pitch P2 of the reflective electrode 33 as shown in FIGS. 1 and 2. In this case, it is preferable that the cathode 12 and the light shield layer 16 are disposed right above the slit 37S between the plurality of reflective electrodes 33, that does not contribute to the display of the reflective LCD 300. This provides an advantage that most light reflected by the reflective electrode 33 is visually recognized by the viewer 113 through spaces between the light shield layer 16 without being shielded by the light shield layer 16.

It is possible that the pitch P1 of the cathode 12 and the light shield layer 16 of the lighting device 200 is smaller than the pitch P2 of the reflective electrode 33 and a ratio of the pitch P1 to the pitch P2, that is, P1/P2 is 1/natural number. Although interference fringes or moiré fringes can occur in the display of the reflective LCD 300 when the pitch P1 and the pitch P2 are equal, these phenomenon can be prevented by thus setting the ratio of the pitch P1 to the pitch P2.

Alternatively, it is possible that the pitch P1 of the cathode 12 and the light shield layer 16 of the lighting device 200 is larger than the pitch P2 of the reflective electrode 33 and a ratio of the pitch P1 to the pitch P2, that is, P1/P2 is a natural number. This setting can also prevent interference fringes or moiré fringes.

Next, an operation of the described reflective LCD 300 will be described. First, light entering the reflective LCD 300 from the lighting device 200 is changed to linearly polarized light corresponding to the polarization axis of the polarizing layer 41, passes through the light scattering layer 40, and is changed to circularly polarized light by passing through the λ/4 wavelength plate 39. This circularly polarized light passes through the common electrode 36, and then enters the liquid crystal layer 42.

At this time, the electric field of the liquid crystal layer 42 changes depending on application or non-application of a voltage to the reflective electrode 33 and the common electrode 36, and the optical retardation of the liquid crystal layer 42 changes in each of the pixels. The circularly polarized light entering the liquid crystal layer 42 is changed to left-circularly or right-circularly polarized light by this optical retardation and reflection by the reflective electrode, and emitted out therefrom. This circularly polarized light passes through the λ/4 wavelength plate 39 again, is changed to linearly polarized light corresponding to its circular direction, and enters the polarizing layer 41. When the polarization axis of this linearly polarized light corresponds to the polarization axis of the polarizing layer 41, the linearly polarized light passes through the polarizing layer 41 and provides a white display. When the polarization axis of this linearly polarized light is perpendicular to the polarization axis of the polarizing layer 41, the linearly polarized light does not pass through the polarizing layer 41 and provides a black display.

In the display, the slits 37S between the plurality of reflective electrodes 33 and the projections 37P of the common electrode 36, that are provided as the alignment control portions, enable the multi-domain alignment of the liquid crystal layer 42 to provide a wide view angle.

With the lighting device 200 having the described structure, the light shield layer 16 can minimize leakage of light emitted by the emissive region 13a to the viewer 113, and enhance the contrast of a display of the reflective LCD 300, compared with the conventional art. That is, the contrast of a display can be enhanced both in the bright environment with strong external light and in the dark environment with insufficient external light, compared with the conventional art.

Since a glass substrate or the like does not exist between the organic EL element layer 15 of the lighting device 200 and the liquid crystal layer 42 of the reflective LCD 300, the use efficiency of light emitted by the emissive region 13a of the organic EL element layer 15 can be increased.

In addition to the non-existence of the glass substrate or the like, the polarizing layer 41 of the reflective LCD 300 is made of the diffraction grating that can be formed thinner than the polarizing layer made of the generally used PVA (polyvinyl alcohol) or the like. Therefore, the total thickness of the reflective liquid crystal display device can be minimized.

The polarizing layer 41 is made of the diffraction grating in the reflective LCD 300 of the described embodiment, but the invention is not limited to this. That is, although not shown, the polarizing layer 41 can be made by coating dichromatic dye molecules instead. In this case, a solution containing the dichromatic dye molecules is coated on the anode 11 by, for example, printing, and then set and regularly aligned. Thus, the thinner polarizing layer than a polarizing layer made of the generally used PVA (polyvinyl alcohol) or the like can be formed.

Although the projections 37P are provided as the alignment control portions on the common electrode 36 on the reflective LCD 300 of the embodiment, the invention is not limited to this. For example, although not shown, the slits 37S can be provided in the common electrode 36 instead of the projections 37P. Alternatively, the projections 37P can be omitted.

Although the reflective electrode 33 made of a reflective metal material is made of aluminum (Al), the invention is not limited to this and the reflective electrode 33 can be a layered body of a transparent electrode made of ITO and a reflective film, for example.

Although the organic EL element layer 15 is formed as a light emitting element assembly in the lighting device 200 in the above embodiment, a layer made of the other light emitting element, for example, an inorganic EL element can be formed instead of the organic EL element layer 15.

Although the light shield layer 16 covering the cathode 12 is formed in the lighting device 200 of the embodiment, the light shield layer 16 can be omitted. The cathode 12 functions as the light shield layer in this case although a slight amount of light leaks from the emissive region 13a to the viewer 113 side.

Figure 6:
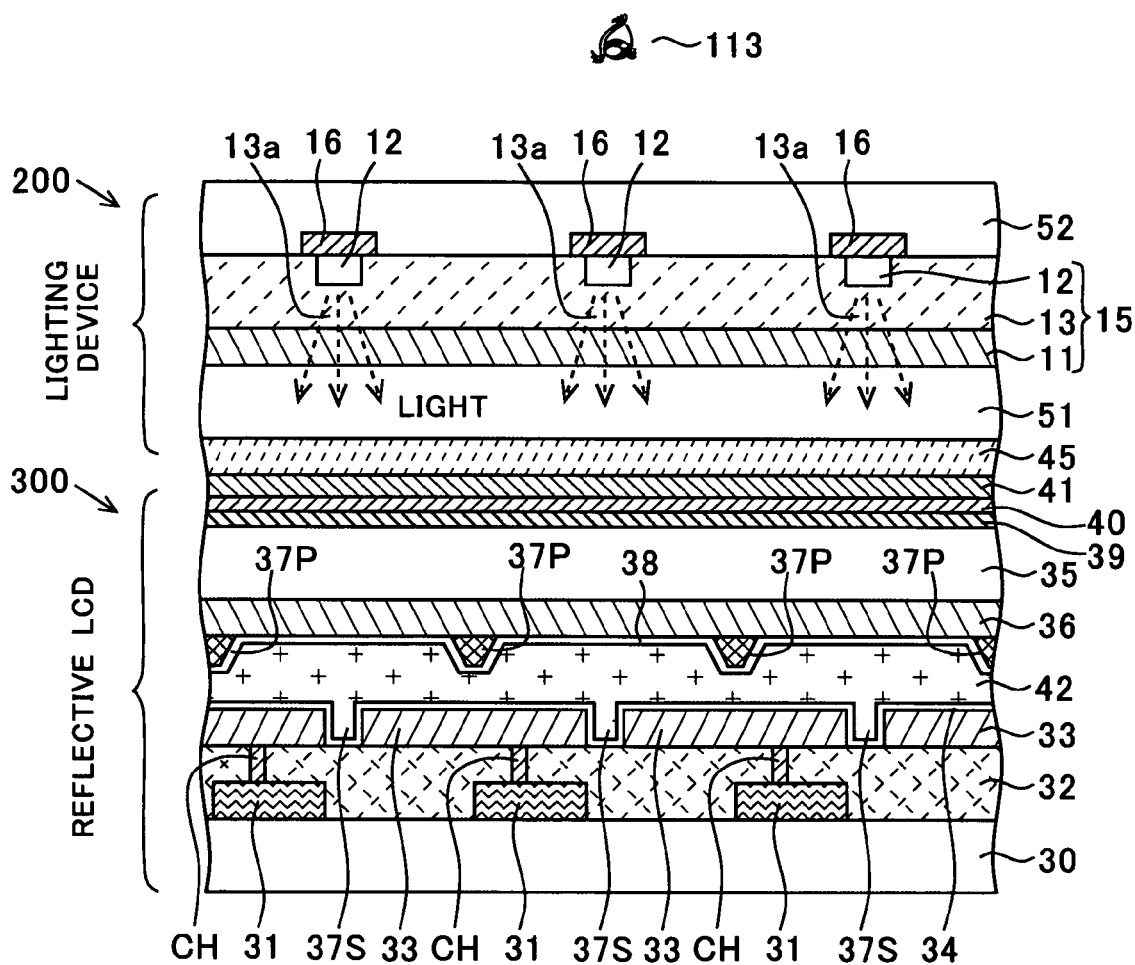
FIG. 6 is a cross-sectional view of the display device of the second and third embodiments of the invention.

Next, a second embodiment of the invention will be described referring to figures. FIG. 6 is a cross-sectional view of the display device having a lighting device and a reflective LCD (liquid crystal display device) of the second embodiment, showing the same cross section as that of FIG. 1 along line X-X. With respect to FIG. 6, descriptions will be given with the same numerals for the same components as those shown in FIG. 2.

A lighting device 200 is disposed with its light emitting surface opposed to a display surface of a reflective LCD 300 as shown in FIGS. 1 and 6. That is, the lighting device 200 is a light source of a front light of the reflective LCD 300.

A structure of the lighting device 200 will be described first. An organic electroluminescent element layer 15 (hereafter, abbreviated to an "organic EL element layer 15") is formed, being interposed between a first transparent substrate 51 and a second transparent substrate 52 made of a glass substrate or the like. The organic EL element layer 15 includes an anode 11 made of a transparent conductive material such as ITO (Indium Tin Oxide) or IZO (Indium Zinc Oxide) and formed on substantially the whole surface of the first transparent substrate 51, an organic layer 13 formed on this anode 11, and a cathode 12 formed on the organic layer 13 and patterned into a predetermined shape with a predetermined pitch, for example, stripes.

The organic layer 13 includes a so-called electron transport layer 13E, an emissive layer 13L, and a hole transport layer 13H. The cathode 12 includes, for example, an aluminum (Al layer), a layered body of a magnesium layer (Mg layer) and a silver layer (Ag layer), or a calcium layer (Ca layer). It is preferable that the anode 11 is about 100 nm, the cathode 12 is about 500 nm, and the organic layer 13 is about 100 nm in thickness.

In this organic EL element layer 15, a region of the organic layer 13 interposed between the anode 11 and the cathode 12 is an emissive region 13a. That is, a region of the organic layer 13 immediately under the cathode 12 is the emissive region 13a, and the organic EL element layer 15 in this region functions as a light emitting element. In a plan view of this emissive region 13a, this emissive region 13a has the same predetermined shape as that of the cathode 12, that is, forms stripes. This emissive region 13a emits light (unpolarized light) by applying a positive potential to the anode 11 and a negative potential to the cathode 12. The other region of the organic layer 13 does not emit light as a non-emissive region. Light emitted by the emissive region 13a proceeds in a direction perpendicular to the longitudinal direction of the stripes of the emissive region 13a equally from the emissive region 13a.

Furthermore, a light shield layer 16 is formed covering the cathode 12 patterned into stripes. The light shield layer 16 is also patterned into the same shape as that of the cathode 12, that is, stripes. The light shield layer 16 is provided for shielding light emitted upward from the emissive region 13a, and thus need have a function as a light reflection layer for reflecting light or a light absorption layer for absorbing light.

The light shield layer 16 is made of, for example, a chromium (Cr) or aluminum oxide ($Al_2O_3$) layer or the like if it functions as the light reflection layer. If the light shield layer 16 functions as the light absorption layer, it is made of a black pigment layer made of a photoresist material containing a black pigment, a black dye layer made of a photoresist material containing black dye, a chromium oxide layer, or the like. The light shield layer 16 is preferably about 10 nm or less in thickness.

Light emitted downward (on the opposite side to the viewer 113) from the emissive region 13a of the lighting device 200 enters the reflective LCD 300 through the transparent anode 11 and the first transparent substrate 51. Light emitted upward (in the direction to the viewer 113) from the emissive region 13a is reflected downward or absorbed by the cathode 12 and the light shield layer 16. Therefore, light from the emissive region 13a is minimized from directly entering the eyes of the viewer 113 watching the lighting device 200 from thereabove.

It is preferable that the width of the light shield layer 16 is larger than the width of the patterned cathode 12 for enhancing this light shield effect. Furthermore, it is preferable that a length L1 between the edge of the patterned cathode 12 and the edge of the light shield layer 16 is equal to or larger than the total thickness L2 of the emissive region 13a of the organic layer 13 and the patterned cathode 12 for further enhancing the light shield effect, as shown in FIG. 4.

Although the cathode 12 is patterned into a predetermined shape with a predetermined pitch, for example, stripes and the anode 11 is not patterned in the structure of the embodiment, it is possible to change positions of the cathode 12 and the anode 11 as an modification. That is, it is possible to place the anode 11 in the position of the cathode 12 and the cathode 12 in the position of the anode 11 in FIG. 6. In this case, the anode 11 is patterned into the predetermined shape and the cathode 12 is not patterned. That is, a region of the organic layer 13 immediately on the anode 11 serves as the emissive region 13a.

Furthermore, it is possible that the anode 11 and the cathode 12 are formed on the whole surface without patterned at all and at least one of the three layers of the electron transport layer 13E, the emissive layer 13L, and the hole transport layer 13H forming the organic layer 13 is patterned in the predetermined shape. In this case, a region where all the three layers are superposed is the emissive region, and a region where any one of the three layers is missing is the non-emissive region.

Furthermore, it is preferable that the pitch of the patterned cathode 12 (alternatively, the anode 11, or any one of the three layers forming the organic layer 13) is about 1 mm or less for preventing the viewer 113 from sensing a discomfort in the eyes when light emitted by the emissive region 13a is reflected by the reflective LCD 300 and visually recognized by the viewer 113.

Descriptions will be given supposing the cathode 12 is patterned into a predetermined shape, that is, stripes, hereafter. This embodiment also has the same structure, performs the same operation, and has the same effect even in the case where the other layer than the cathode 12 is patterned as a layer determining the emissive region 13a, as described above.

Next, a structure of the reflective LCD 300 will be described. As shown in FIG. 6, a switching thin film transistor 31 (hereafter, abbreviated to "TFT") is formed on each of a plurality of pixel regions sectioned on the TFT substrate 30 made of, for example, a glass substrate. The TFT 31 is covered with an interlayer insulation film 32. A pixel electrode made of, for example, a metal material reflecting light such as aluminum (Al) or the like, that is, a reflective electrode 33 is formed on the interlayer insulation film 32, corresponding to each of the TFTs 31. The reflective electrode 33 is connected with a drain or a source of the corresponding TFT 31 by a conductive filling member (not shown) or the like through a contact hole CH formed in the interlayer insulation film 32.

A separating region, that is, a slit 37S having a predetermined width is provided between the adjacent reflective electrodes 33. This slit 37S has a function as an alignment control portion for multi-domain alignment of a liquid crystal layer 42 that will be described below. An alignment film 34 for aligning liquid crystal molecules at a predetermined angle relative to the TFT substrate 30 is formed covering the reflective electrodes 33 and the slits 37S.

An opposing substrate 35 made of, for example, a glass substrate is disposed, being opposed to the TFT substrate 30 formed with the reflective electrodes 33. A common electrode 36 made of, for example, ITO is formed on a front surface (a surface opposed to the TFT substrate 30) of the opposing substrate 35. Projections 37P as alignment control portions for multi-domain alignment of liquid crystal molecules of the liquid crystal layer 42 in predetermined two different directions, that will be described below, are formed on the common electrode 36. The projections 37P are formed by patterning a resist material for example. An alignment film 38 is further formed covering the common electrodes 36 and the projections 37P.

A $\lambda/4$ wavelength plate 39 (a quarter wavelength plate) is disposed on the back surface (the surface opposed to the viewer 113) of the opposing substrate 35, as a retardation layer for causing an optical retardation of a quarter of a wavelength $\lambda$ of light. The $\lambda/4$ wavelength plate 39 changes linearly polarized light to circularly polarized light, or changes circularly polarized light to linearly polarized light. It is possible to further laminate a $\lambda/2$ wavelength plate (a half wavelength plate) (not shown) causing optical retardation of a half of a wavelength $\lambda$ of light on this $\lambda/4$ wavelength plate 39 for the polarization change of broadband light. A light scattering layer 40 made of, for example, a diffusion adhesion layer and a polarizing layer 41 are further laminated on the $\lambda/4$ wavelength plate 39 in this order. The light scattering layer 40 is provided for scattering light emitted from the lighting device 200 so as to irradiate the reflective electrode 33 with the light. The polarizing layer 41 is the same as that of the first embodiment, and has a predetermined polarization axis, and extracts linearly polarized light from light entering the polarizing layer 41, corresponding to its polarization axis.

A liquid crystal layer 42 is sealed between the TFT substrate 30 and the opposing substrate 35. The liquid crystal layer 42 is made of, for example, liquid crystal molecules (e.g. a nematic liquid crystal) having positive dielectric anisotropy and helically aligned to have a predetermined optical rotatory 'power,' and operates in a TN (Twisted Nematic) mode or a MTN (Mixed TN) mode. In this case, an alignment treatment is performed to the pair of alignment films 34 and 38 where the liquid crystal layer 42 is interposed therebetween so that those alignment directions perpendicularly crossing each other.

This liquid crystal layer 42 can be the other liquid crystal layer than above as long as it is suitable for the reflective LCD using a sheet of polarizing layer 41. That is, the liquid crystal layer 42 can be made of liquid crystal molecules (e.g. a nematic liquid crystal) having positive dielectric anisotropy and homogeneously aligned, and operate in an electrically controlled birefringence mode, that is, a ECB mode. In this case, an alignment treatment is performed to the pair of the alignment films 34 and 38 where the liquid crystal layer 42 is interposed therebetween so that the alignment directions of the films 34 and 38 extend parallel with each other.

Alternatively, the liquid crystal layer 42 can be made of liquid crystal molecules (e.g. a nematic liquid crystal) having negative dielectric anisotropy and vertically aligned, and operate in a vertical aligned mode, that is, a VA mode. In this case, the pair of alignment films 34 and 38 where the liquid crystal layer 42 is interposed therebetween is a so-called vertical alignment film that initially aligns liquid crystal molecules vertically relative to the alignment film.

Next, the connection between the lighting device 200 and the reflective LCD 300 will be described. It is preferable that the lighting device 200 is disposed adjacent to the reflective LCD 300 thereabove as shown in FIGS. 1 and 6. If an air layer exists between the lighting device 200 and the reflective LCD 300, light emitted from the first transparent substrate 51 of the lighting device 200 is reflected when entering the air layer and returns to the viewer side, thereby degrading the contrast.

Therefore, it is preferable that the lighting device 200 and reflective LCD 300 are attached with a resin layer 45 (e.g. a UV curable resin layer or a visible light curable resin layer) having the same refractive index as that of the first transparent substrate 51 therebetween in order to minimize light refraction. Alternatively, it is possible to attach the lighting device 200 and the reflective LCD 300 with the polarizing layer 41 being directly in contact with the organic EL element layer 15 without the resin layer 45 and the first transparent substrate 51 interposed therebetween, as shown in FIG. 2. In this case, the use efficiency of light emitted from the lighting device 200 can be enhanced, and the total thickness of the display device can be minimized.

Next, a positional relationship between the lighting device 200 and the reflective LCD 300 will be described. A pitch P1 of the cathode 12 and the light shield layer 16 of the lighting device 200 is equal to a pitch P2 of the reflective electrode 33 as shown in FIGS. 1 and 6. In this case, it is preferable that the cathode 12 and the light shield layer 16 are disposed right above the slit 37S between the plurality of reflective electrodes 33, that does not contribute to the display of the reflective LCD 300. This provides an advantage that most light reflected by the reflective electrode 33 is visually recognized by the viewer 113 through spaces between the light shield layer 16 without shielded by the light shield layer 16.

It is possible that the pitch P1 of the cathode 12 and the light shield layer 16 of the lighting device 200 is smaller than the pitch P2 of the reflective electrode 33 and a ratio of the pitch P1 to the pitch P2, that is, P1/P2 is 1/natural number. Although interference fringes or moiré fringes can occur in the display of the reflective LCD 300 when the pitch P1 and the pitch P2 are equal, these phenomenon can be prevented by thus setting the ratio of the pitch P1 to the pitch P2.

Alternatively, it is possible that the pitch P1 of the cathode 12 and the light shield layer 16 of the lighting device 200 is larger than the pitch P2 of the reflective electrode 33 and a ratio of the pitch P1 to the pitch P2, that is, P1/P2 is a natural number. This setting can also prevent interference fringes or moiré fringes.

Figure 7:
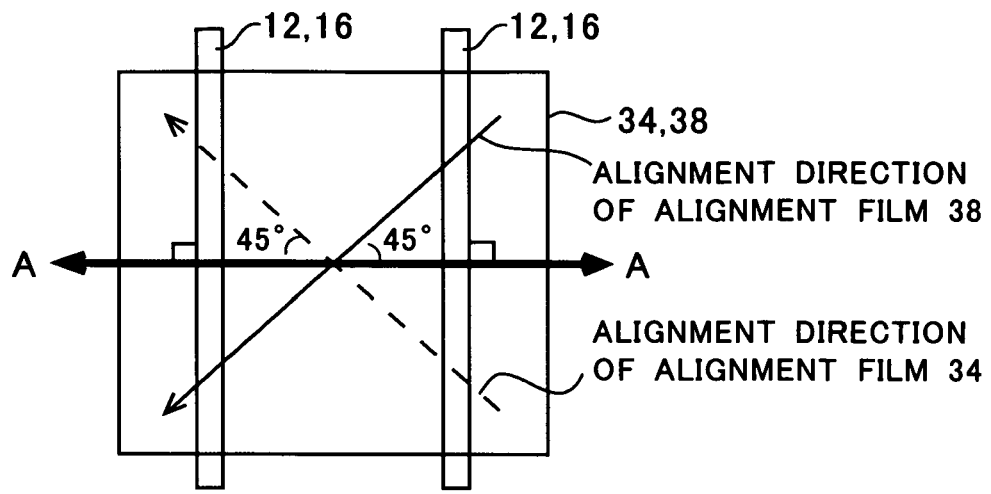
FIG. 7 is a plan view of the display device of the second embodiment of the invention on the lighting device side.
Figure 8:
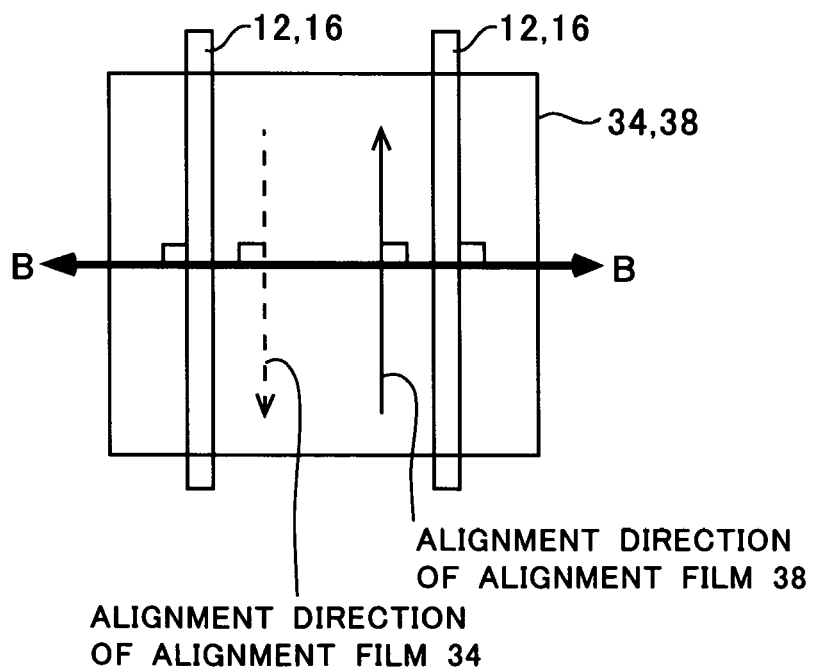
FIG. 8 is a plan view of the display device of the second embodiment of the invention on the lighting device side.

FIGS. 7-9 shown examples of the arrangement among the liquid crystal alignment direction of the alignment films 34, 38, the wider direction of the view angle, and the direction of the cathode 12. Although the following explanation is based on the second embodiment, the same configuration may apply to the first embodiment.

Figure 9A:
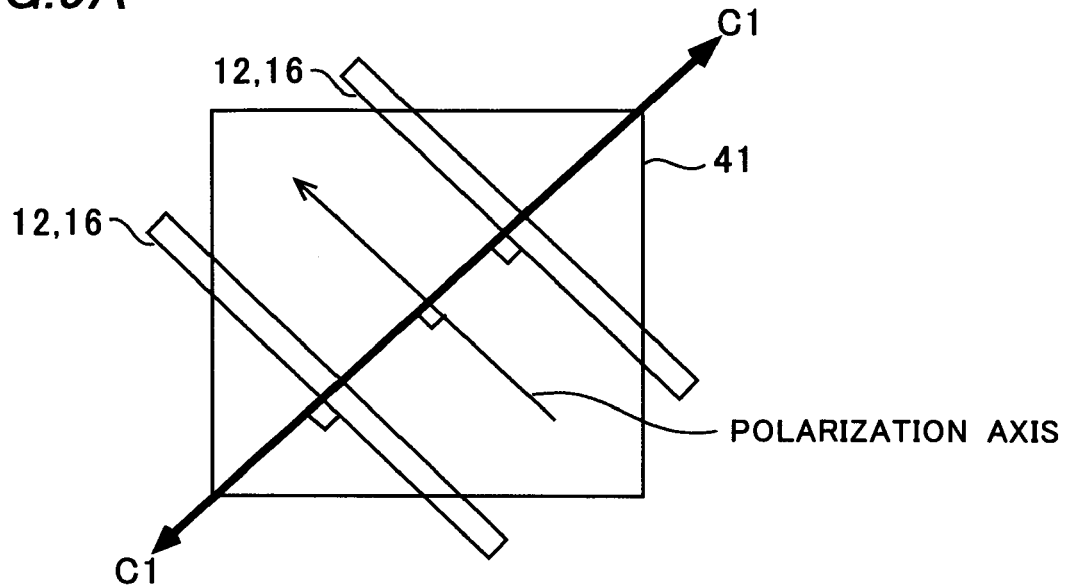
FIGS. 9A and 9B are plan views of the display device of the second embodiment of the invention on the lighting device side.
Figure 9B:
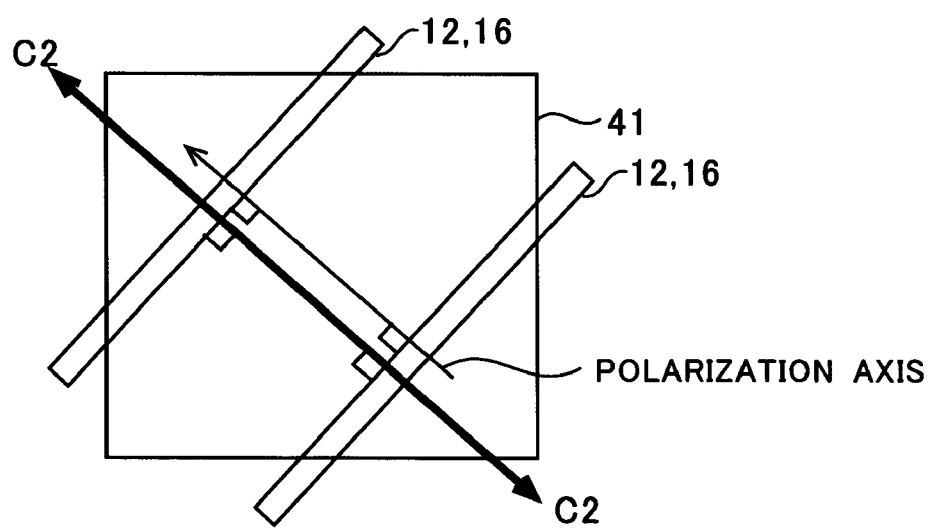

FIGS. 7 to 9 are plan views of the display device of the second embodiment of the invention on the lighting device side. FIGS. 7, 8 and 9 show the plan views in a case of the TN mode, the ECB mode, and the VA mode for the operation of the liquid crystal layer 42, respectively. FIGS. 7 and 8 show the alignment films 34 and 38 and the patterned cathode 12 and light shield layer 16 only for convenience of the description. FIGS. 9A and 9B show the polarizing layer 41 and the patterned cathode 12 and light shield layer 16 only.

In the liquid crystal layer 42 operating in the TN mode, a wider direction A of a view angle on the display surface is shifted by 45 degrees toward the rotatory direction of the liquid crystal molecules from the alignment direction of the alignment film 34 (shown by a dotted arrow) or the alignment direction of the alignment film 38 (shown by a solid arrow) as shown in FIG. 7. The cathode 12 and the light shield layer 16 corresponding to the emissive region 13a are positioned normal to the wider direction A of the view angle. With this positional relationship, most light emitted by the emissive region 13a enters the reflective LCD 300 along the wider direction A of the view angle on the display surface of the LCD 300, and is reflected by the reflective electrode 33 toward the viewer 113 side along the direction A.

In the liquid crystal layer 42 operating in the ECB mode, a wider direction B of a view angle on the display surface perpendicularly crosses the alignment direction of the alignment film 34 (shown by a dotted arrow) or the alignment direction of the alignment film 38 (shown by a solid arrow) as shown in FIG. 8. The cathode 12 and the light shield layer 16 are positioned normal to the wider direction B of the view angle. That is, the cathode 12 and the light shield layer 16 are disposed with those longitudinal directions extending parallel with the alignment directions of the alignment films 34 and 38. With this positional relationship, most light emitted by the emissive region 13a enters the reflective LCD 300 along the wider direction B of the view angle on the display surface, and is reflected by the reflective electrode 33 toward the viewer 113 side along the direction B.

In the liquid crystal layer 42 operating in the VA mode, there are two kinds of wider directions of the view angle on the display surface as shown in FIGS. 9A and 9B. One is a direction C1 perpendicularly crossing the polarization axis of the polarizing layer 41, and another is a direction C2 extending parallel with the polarization axis of the polarizing layer 41.

As shown in FIG. 9A, the cathode 12 and the light shield layer 16 are positioned normal to the wider direction C1 of the view angle. That is, the cathode 12 and the light shield layer 16 are disposed with those longitudinal directions extending parallel with the polarization axis of the polarizing layer 41.

Alternatively, the cathode 12 and the light shield layer 16 are positioned normal to the wider direction C2 of the view angle as shown in FIG. 9B. That is, the cathode 12 and the light shield layer 16 are disposed with those longitudinal directions perpendicularly crossing the polarization axis of the polarizing layer 41.

With these positional relationships, most light emitted by the emissive region 13a enters the reflective LCD 300 along the wider direction C1 or C2 of the view angle on the display surface of the LCD 300, and is reflected by the reflective electrode 33 toward the viewer 113 side along the direction C1 or C2.

Next, an operation of the described reflective LCD 300 will be described. First, light entering the reflective LCD 300 from the lighting device 200 is changed to linearly polarized light corresponding to the polarization axis of the polarizing layer 41, passes through the light scattering layer 40, and is changed to circularly polarized light by passing through the λ/4 wavelength plate 39. This circularly polarized light passes through the opposing substrate 35 and the common electrode 36, and then enters the liquid crystal layer 42.

At this time, the electric field of the liquid crystal layer 42 changes depending on application or non-application of a voltage to the reflective electrode 33 and the common electrode 36, and the optical retardation of the liquid crystal layer 42 changes in each of the pixels. The circularly polarized light entering the liquid crystal layer 42 is changed to left-circularly or right-circularly polarized light by this optical retardation and reflection by the reflective electrode, and emitted out therefrom. This circularly polarized light passes through the λ/4 wavelength plate 39 again, is changed to linearly polarized light corresponding to the circular direction, and enters the polarizing layer 41. When the polarization axis of this linearly polarized light corresponds to the polarization axis of the polarizing layer 41, the linearly polarized light passes through the polarizing layer 41 and provides a white display. When the polarization axis of this linearly polarized light is perpendicular to the polarization axis of the polarizing layer 41, the linearly polarized light does not pass through the polarizing layer 41 and provides a black display.

At this time, in the display, light emitted by the emissive region 13a of the organic EL element layer 15 enters the reflective LCD 300 along the wider direction of the view angle on the display surface of the LCD 300. The light is then reflected by the reflective electrode 33 toward the viewer 113 side along the wider direction of the view angle. Therefore, the contrast of the display can be enhanced in any of the described modes (TN, ECB, and VA modes). Furthermore, luminance of the display under external light can be enhanced.

Furthermore, the slits 37S between the plurality of reflective electrodes 33 and the projections 37P of the common electrode 36 provided as the alignment control portions enable the multi-domain alignment of the liquid crystal layer 42, thereby providing the further wider view angle.

With the lighting device 200 having the described structure, the light shield layer 16 can minimize leakage of light emitted by the emissive region 13a to the viewer 113, and enhance the contrast of a display of the reflective LCD 300, compared with the conventional art. That is, the contrast of a display can be enhanced even in the dark environment, that is, in the environment with insufficient external light, compared with the conventional art.

Although the projections 37P are provided as the alignment control portions on the common electrode 36 on the reflective LCD 300 of the embodiment, the invention is not limited to this. For example, although not shown, the slits 37S can be provided in the common electrode 36 instead of the projections 37P. Alternatively, the projections 37P can be omitted.

Although the reflective electrode 33 made of a reflective metal material is made of aluminum (Al), the invention is not limited to this and the reflective electrode 33 can be a layered body of a transparent electrode made of ITO and a reflective film, for example.

Although the organic EL element layer 15 is formed as a light emitting element assembly in the lighting device 200 of the embodiment, the other light emitting element, for example, a layer made of an inorganic EL element can be formed instead of the organic EL element layer 15.

Although the light shield layer 16 covering the cathode 12 is formed in the lighting device 200 of the embodiment, the light shield layer 16 can be omitted. The cathode 12 functions as the light shield layer in this case although a slight amount of light leaks from the emissive region 13a to the viewer 113 side.

Next, a third embodiment of the invention will be described referring to FIG. 10. This embodiment modifies the first embodiment and the second embodiment. Accordingly, the plan view of the display device of this embodiment is the same as shown in FIG. 1. The cross-sectional structure of this display device may be that shown in FIG. 2 or that shown in FIG. 6. The modification is the spatial arrangement of the structures shown in FIGS. 1 and 2.

Figure 10:
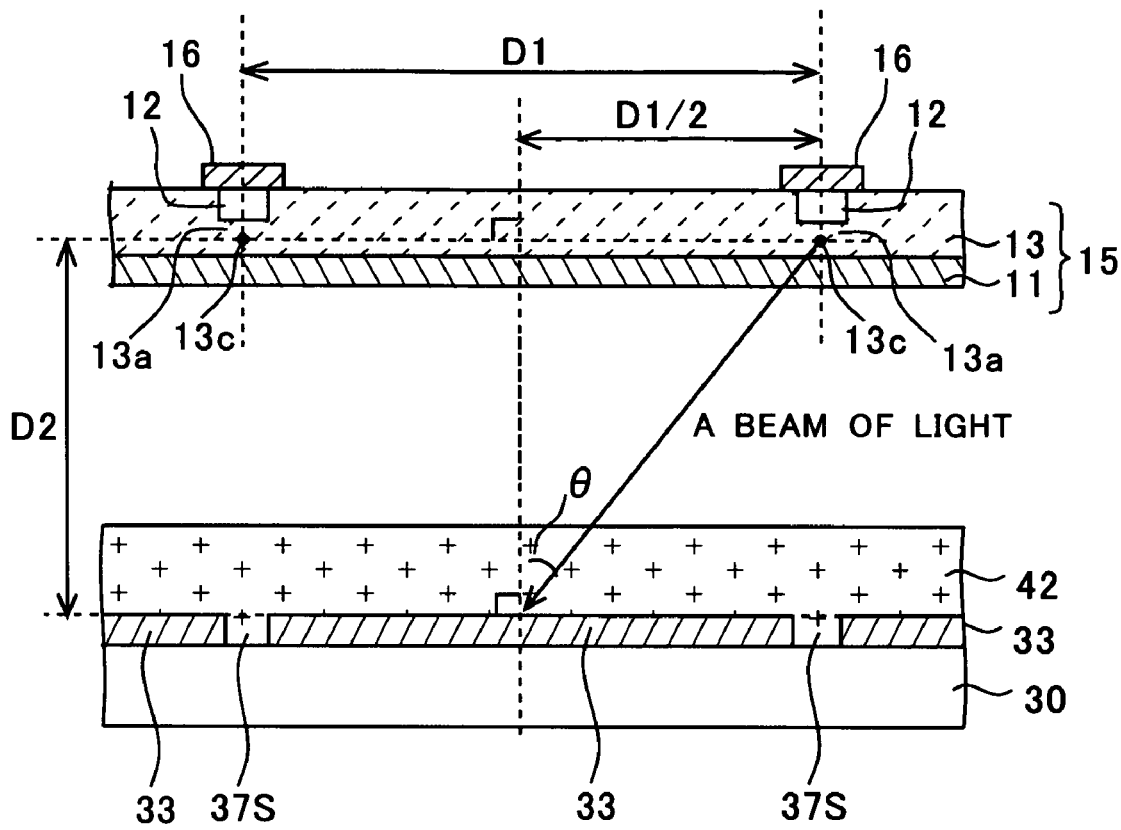
FIG. 10 is an enlarged partial cross-sectional view of the display device of the third embodiment of the invention.

FIG. 10 is an enlarged partial cross-sectional view of the display device of this embodiment of the invention. FIG. 10 shows the light shield layer 16 of the lighting device 200, components of the organic EL element layer 15, the liquid crystal layer 42, the reflective electrode 33 of the reflective LCD 300, and the TFT substrate 30 only, and the other components are omitted, for convenience of the description.

First, as shown in FIG. 10, a length between centers 13c of the adjacent emissive regions 13a of the organic EL element layer 15 is defined as D1, and a length between the center 13c of the emissive region 13a and the front surface of the reflective electrode 33 in a perpendicular direction is defined as D2. An angle formed by a perpendicular bisector of a line segment between the centers 13c of the adjacent emissive regions 13a and a beam of light entering the front surface of the reflective electrode 33 from the center 13c of the emissive region 13a is defined as θ. The angle θ is given by the next equation of the arctangent function with the length D1 and the length D2 as variables, that is, arc tan(D1, D2).

$$\theta = \arctan\left(\frac{D1}{2 \times D2}\right) \quad \text{[Equation 1]}$$

At this time, in this embodiment, the angle θ is determined to a predetermined angle so as not to increase a view angle dependency of the reflective LCD 300 as the positional relationship between the lighting device 200 and the reflective LCD 300. That is, the center 13c of the emissive region 13a of the organic EL element layer 15 and the reflective electrode 33 are disposed, having the length D1 and length D2 that can provide the predetermined angle θ.

The predetermined angle θ is larger than 0 degree and less than 20 degrees inclusive when the liquid crystal layer 42 operates in the TN mode, for example. The predetermined angle θ is larger than 0 degrees and less than 50 degree inclusive when the liquid crystal layer 42 operates in the vertical alignment mode, for example.

As a method of obtaining this angle θ, for example, the cathode 12 (or a layer determining the emissive region 13a) of the organic EL element layer 15 is patterned so as to obtain the length D1 satisfying the equation 1. Furthermore, at least one of the plurality of layers between the organic layer 13 and the reflective electrode 33 is adjusted so as to obtain the length D2 satisfying the equation 1.

Next, an operation of the described reflective LCD 300 will be described. First, light entering the reflective LCD 300 from the lighting device 200 is changed to linearly polarized light corresponding to the polarization axis of the polarizing layer 41, passes through the light scattering layer 40, and is changed to circularly polarized light by passing through the λ/4 wavelength plate 39. This circularly polarized light passes through the opposing substrate 35 and the common electrode 36, and then enters the liquid crystal layer 42.

At this time, the electric field of the liquid crystal layer 42 changes depending on application or non-application of a voltage to the reflective electrode 33 and the common electrode 36, and the optical retardation of the liquid crystal layer 42 changes in each of the pixels. The circularly polarized light entering the liquid crystal layer 42 is changed to left-circularly or right-circularly polarized light by this optical retardation and reflection by the reflective electrode, and emitted out therefrom. This circularly polarized light passes through the λ/4 wavelength plate 39 again, is changed to linearly polarized light corresponding to the circular direction, and enters the polarizing layer 41. When the polarization axis of this linearly polarized light corresponds to the polarization axis of the polarizing layer 41, the linearly polarized light passes through the polarizing layer 41 and provides a white display. When the polarization axis of this linearly polarized light is perpendicular to the polarization axis of the polarizing layer 41, the linearly polarized light does not pass through the polarizing layer 41 and provides a black display.

In the display, a beam of light from the center 13c of the emissive region 13a of the organic EL element layer 15 enters the reflective electrode 33 at the angle θ provided by the equation 1. This can minimize degradation of optical characteristics such as contrast, that is, increase of the view angle dependency, that is caused by an angle of a beam of light entering the reflective electrode 33 from the emissive region 13a.

In the display, the slits 37S between the plurality of reflective electrodes 33 and the projections 37P of the common electrode 36, that are provided as the alignment control portions, enable the multi-domain alignment of the liquid crystal layer 42 to minimize the increase of the view angle dependency.

With the lighting device 200 having the described structure, the light shield layer 16 can minimize leakage of light emitted by the emissive region 13a to the viewer 113, and enhance the contrast of a display of the reflective LCD 300, compared with the conventional art. That is, the contrast of a display can be enhanced even in the dark environment, that is, in the environment with insufficient external light, compared with the conventional art.

Although the projections 37P are provided as the alignment control portions on the common electrode 36 on the reflective LCD 300 of the embodiment, the invention is not limited to this. For example, although not shown, the slits 37S can be provided in the common electrode 36 instead of the projections 37P. Alternatively, the projections 37P can be omitted.

Although the reflective electrode 33 made of a reflective metal material is made of aluminum (Al), the invention is not limited to this and the reflective electrode 33 can be a layered body of a transparent electrode made of ITO and a reflective film, for example.

Although the organic EL element layer 15 is formed as a light emitting element assembly in the lighting device 200 in the above embodiment, a layer made of the other light emitting element, for example, an inorganic EL element can be formed instead of the organic EL element layer 15.

Although the light shield layer 16 covering the cathode 12 is formed in the lighting device 200 of the embodiment, the light shield layer 16 can be omitted. The cathode 12 functions as the light shield layer in this case although a slight amount of light leaks from the emissive region 13a to the viewer 113 side.

Figure 11:
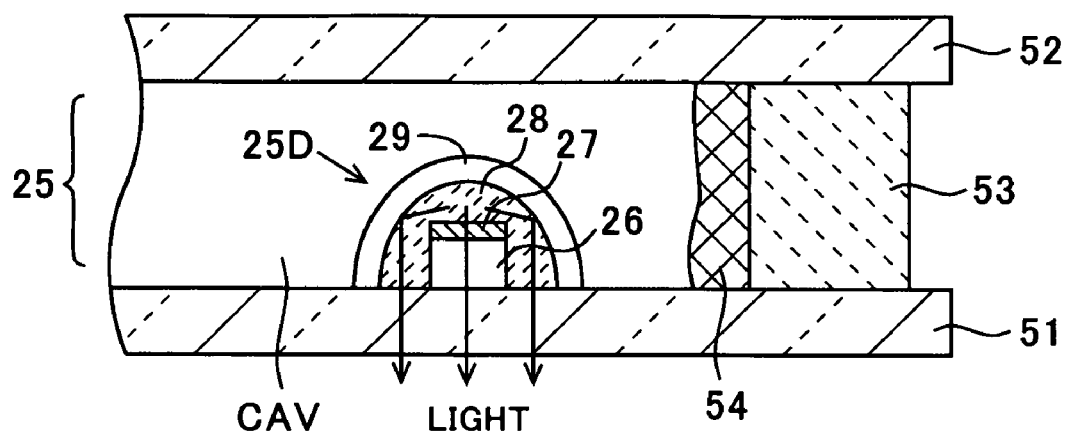
FIG. 11 is an enlarged partial cross-sectional view of the display device of the first to third embodiments of the invention.
Figure 12:
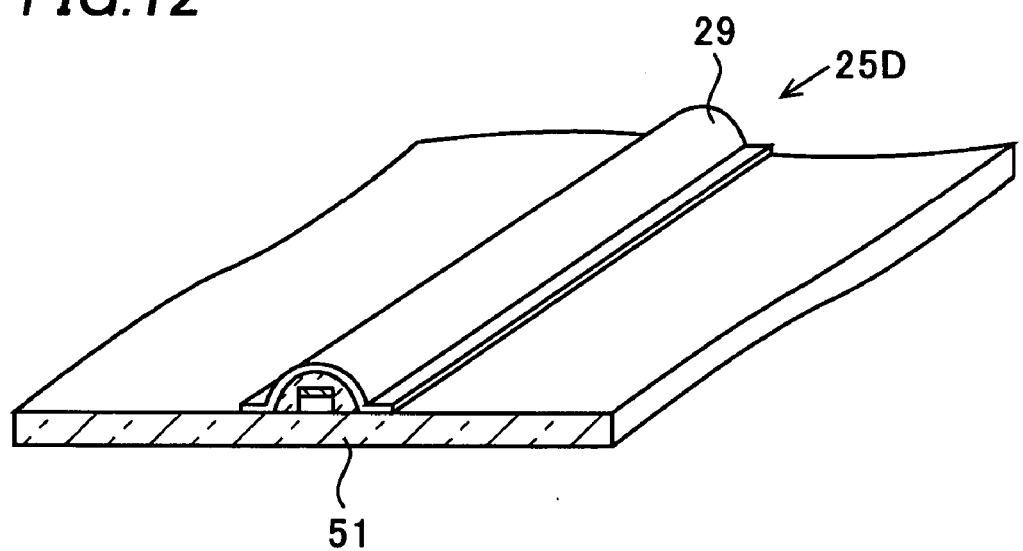
FIG. 12 is an enlarged partial schematic perspective view of the display device of the first to third embodiments of the invention.
Figure 13:
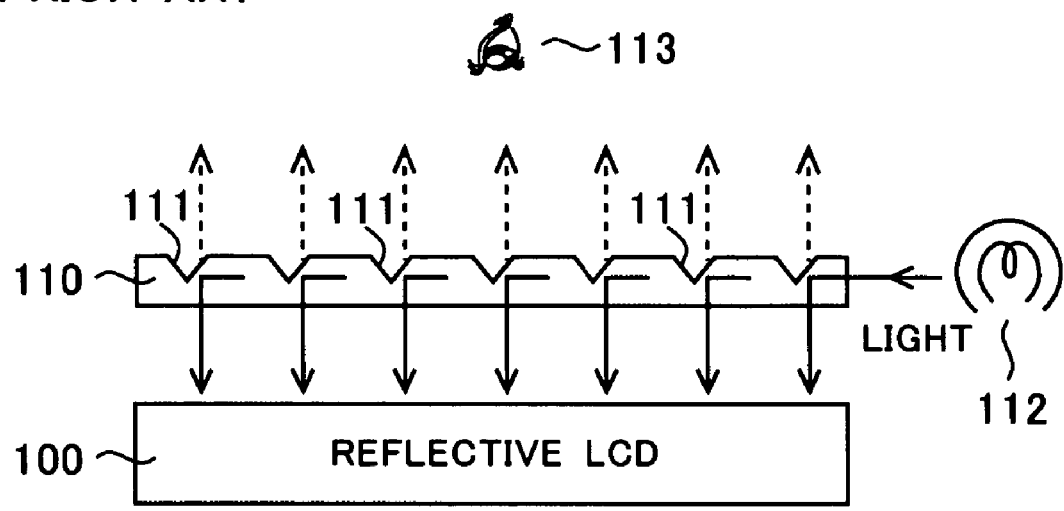
FIG. 13 is a cross-sectional view of a display device having a lighting device of a conventional art.

The structure of the organic EL element layer 15 of the second embodiment may be modified as shown in FIG. 11. FIG. 11 is an enlarged partial cross-sectional view of the organic EL element layer 25 that is similar to the cross-section shown in FIG. 6. FIG. 12 is an enlarged partial schematic perspective view of a plurality of light emitting elements 25D forming the organic EL element layer 25. It is noted that FIGS. 11 and 12 show only one of the plurality of light emitting elements 25D.

The organic EL element layer 25 is made of the light emitting elements 25D such as organic EL elements, as shown in FIG. 11. A step forming layer 26 is formed on the first glass substrate 51 in a region for forming the light emitting element 25D. This step forming layer 26 is made of transparent resin such as photosensitive acrylic resin. An anode 27 made of a transparent conductive material such as ITO (Indium Tin Oxide) or IZO (Indium Zinc Oxide) is formed on the step forming layer 26.

An organic layer 28 having an arch-shaped surface is formed, covering the top surface of the anode 27 and the side surface of the step forming layer 26 and the anode 27. The organic layer 28 includes a hole transport layer 13H, an emissive layer 13L, and an electron transport layer 13E that are formed on the anode 27 in this order. The organic layer 28 can form the arch shape, for example, by forming the hole transport layer 13H thicker than the emissive layer 13L and the electron transport layer 13E. Furthermore, a cathode 29 made of metal such as aluminum or chromium is formed, covering the organic layer 28.

This light emitting element 25D is sealed in a space CAV between the first transparent substrate 51 and the second transparent substrate 52 with a sealing member 53 such as UV curable resin therebetween. Furthermore, a desiccant 54 is disposed in the space CAV on the sealing member 53 side. Alternatively, it is possible to mix desiccant particles in the sealing member 53. It is preferable to seal a dry nitrogen gas in this space CAV. This structure can prevent deterioration of the organic layer 28 due to moisture.

Alternatively, it is possible to fill the space CAV with resin although not shown. In this case, light reflection by an interface between the first transparent substrate 51 or the second transparent substrate 52 and the resin can be minimized by using filling resin having a refractive index near a refractive index of glass. It is also possible that acrylic resin mixed with a desiccant or the like can be provided around the light emitting element 25D in the space CAV, for example.

Furthermore, although the light emitting element 25D is formed in a half cylinder shape, for example, as shown in FIG. 12, it is preferable that both ends of the cathode 29 have portions directly formed on the first transparent substrate 51 in this case. With this structure, the organic layer 28 can be certainly covered with the cathode 29, and moisture can be certainly prevented from infiltrating into the organic layer 28.

In the light emitting element 25D, since the step forming layer 26 and the anode 27 are transparent, light emitted downward from the organic layer 28 on the anode 27 goes toward the reflective LCD 300. On the other hand, light emitted in the other directions from the organic layer 28 is reflected by the cathode 29 functioning as a reflection film, being focused on the reflective LCD 300. That is, the directivity of light emitted by the light emitting element 25D is controlled so that the light goes in a vertical direction or almost vertical direction to the reflective LCD 300. This reduces light entering the reflective LCD 300 obliquely relative to its display surface, and thus reduces light emitted out from the reflective LCD 300 obliquely relative to its display surface. Therefore, the contrast of a display is enhanced, and thus a display quality can be enhanced.

Furthermore, in the first to third embodiments, the organic layers 13 or 28 can emit a different color of light by using different chemical materials in a dopant for the emissive layer 13L. In these embodiments, for example, the organic layer 13 or 28 emits light of any one color of R (red), G (green), and B (blue), and a set of the organic layers 13 or 28 of the above three colors emits white light. However, wavelengths of R, G, and B colors are not particularly limited, and the wavelengths can lie in a certain range using a specified wavelength as a reference. That is, the wavelengths of R, G, and B can differ from the generally used wavelengths of R, G, and B.

What is claimed is:

1. A display device comprising:
   a lighting device comprising a first substrate and a plurality of light emitting elements disposed on the first substrate; and
   a reflective liquid crystal display device comprising a second substrate, a plurality of reflective electrodes disposed on the second substrate, a liquid crystal layer disposed on the reflective electrodes, a common electrode disposed between the liquid crystal layer and the first substrate, and a metal polarizing layer disposed on the common electrode and comprising a diffraction grating,
   wherein the lighting device and the reflective liquid crystal display device are stacked so that the first and second substrates define outer portions of the display device, and
   the metal polarizing layer is disposed between the common electrode and the first substrate.

2. The display device of claim 1, wherein the metal polarizing layer comprises an aluminum layer.

3. The display device of claim 1, further comprising a light scattering layer disposed between the polarizing layer and the common electrode.

4. The display device of claim 1, wherein each of the light emitting elements comprises an organic electroluminescent element comprising an anode and a cathode.

5. The display device of claim 4, wherein the anode or the cathode is patterned into a predetermined shape.

6. The display device of claim 5, wherein the cathode is patterned into stripes and disposed above the anode.

7. The display device of claim 4, wherein the organic electroluminescent element comprises an electron transport layer, an emissive layer and a hole transport layer that are disposed between the anode and the cathode, and the electron transport layer, the emissive layer, or the hole transport layer is patterned into a predetermined shape.

8. The display device of claim 1, further comprising a patterned light shield layer covering surfaces of the light emitting elements that face the first substrate,
   each of the light emitting elements comprises an organic electroluminescent element comprising an anode and a cathode,
   the organic electroluminescent element further comprises an electron transport layer, an emissive layer and a hole transport layer that are disposed between the anode and the cathode,
   the anode, the cathode, the electron transport layer, the emissive layer or the hole transport layer is patterned into a stripe pattern, and
   in plan view of the display device a width of the light shield layer covering the anode, the cathode, the electron transport layer, the emissive layer or the hole transport layer patterned into the stripe pattern is greater than a width of the stripe pattern covered by the light shield layer.

9. The display device of claim 1, wherein the light emitting elements are formed into stripes, and a longitudinal direction of the light emitting elements is normal to a wider direction of a view angle of the display.

10. The display device of claim 1, wherein, when a length between centers of two adjacent light emitting elements is defined as D1, a length between the center of the light emitting element and a front surface of the reflective electrode in a perpendicular direction is defined as D2, and an angle formed by a perpendicular bisector of a line segment between the centers of the adjacent light emitting elements and a beam of light incident on the front surface of the reflective electrode from the center of the light emitting element is defined as θ, D1 and D2 are determined so as to provide a predetermined angle that does not increase a view angle dependency of the reflective liquid crystal display device based on the formula, the angle θ=arc tan(D1/(2×D2)).

11. The display device of claim 1, further comprising a reflection film covering the light emitting elements to reflect light from the light emitting elements toward the reflective liquid crystal display device.

12. The display device of claim 1, wherein the light emitting elements emit light having a peak at a specified wavelength.

13. The display device of claim 4, wherein the metal polarizing layer is formed directly on whichever of the anode or the cathode that is disposed closer to the second substrate than to the first substrate.

14. A display device comprising:
   a lighting device comprising a first substrate, a plurality of light emitting elements disposed on the first substrate, and a patterned light shield layer covering surfaces of the light emitting elements that face the first substrate; and
   a reflective liquid crystal display device comprising a second substrate, a plurality of reflective electrodes disposed on the second substrate, a liquid crystal layer disposed on the reflective electrodes, a common electrode disposed on the liquid crystal layer, and a polarizing layer disposed on the common electrode and made of aligned dichromatic dye molecules,
   wherein the lighting device and the reflective liquid crystal display device are stacked so that the first and second substrates define outer portions of the display device,
   each of the light emitting elements comprises an organic electroluminescent element comprising an anode and a cathode,
   the organic electroluminescent element further comprises an electron transport layer, an emissive layer and a hole transport layer that are disposed between the anode and the cathode and having a predetermined thickness,
   the anode, the cathode, the electron transport layer, the emissive layer or the hole transport layer is patterned into a stripe pattern, and
   in plan view of the display device a width of the light shield layer covering the cathode and having an edge thereof extending beyond an edge of the cathode and patterned into the stripe pattern so that the difference between the two edges is greater than the predetermined thickness.

15. The display device of claim 14, further comprising a light scattering layer disposed between the polarizing layer and the common electrode.

16. The display device of claim 14, wherein the cathode is patterned into the stripe pattern and disposed above the anode.

17. The display device of claim 14, wherein the light emitting elements are formed into stripes, and a longitudinal direction of the light emitting elements is normal to a wider direction of a view angle of the display.

* * * * *